US006081219A

United States Patent [19]

Prasanna

[11] Patent Number: 6,081,219

[45] Date of Patent: Jun. 27, 2000

[54] POWER SAVING ARRANGEMENT FOR A FLASH A/D CONVERTER

[75] Inventor: G. N. Srinivasa Prasanna, Clinton, N.J.

[73] Assignee: Lucent Technology, Inc., Murray Hill, N.J.

[21] Appl. No.: 09/073,150

[22] Filed: May 5, 1998

[51] Int. Cl.$^{7}$ .................................................. H03M 1/36

[52] U.S. Cl. .......................................... 341/159; 341/156

[58] Field of Search .................................. 341/159, 155, 341/161, 160, 156

[56] References Cited

U.S. PATENT DOCUMENTS

| | | | |
|---|---|---|---|
| 4,417,233 | 11/1983 | Inoue et al. | 341/155 |
| 4,602,241 | 7/1986 | Dingwall | 341/160 |
| 5,072,221 | 12/1991 | Schmidt | 314/159 |
| 5,194,867 | 3/1993 | Fisher | 341/159 |
| 5,266,952 | 11/1993 | Stone et al. | 341/156 |
| 5,424,736 | 6/1995 | Stryjewski | 341/161 |
| 5,489,904 | 2/1996 | Hadidi | 341/156 |
| 5,489,905 | 2/1996 | Gross, Jr. et al. | 341/160 |
| 5,745,066 | 4/1998 | Hirooka et al. | 341/155 |
| 5,815,106 | 9/1998 | Poss et al. | 341/159 |
| 6,002,356 | 12/1999 | Cooper | 341/160 |

*Primary Examiner*—Howard L. Williams
*Assistant Examiner*—Jean B. Jeanglaude
*Attorney, Agent, or Firm*—Wendy W. Koba, Esq.

[57] ABSTRACT

An arrangement for reducing power consumption in a flash A/D converter uses a predictor module to compute the "next" digital output value (i.e., ŝ(n+1)) and then uses this value to regulate the number of individual comparators required to perform an accurate conversion. The predictor module is disposed as a feedback element between the converter output and the comparator array. Based upon the prediction, the module transmits a control signal to the comparator array, turning "on" and "off" subsets of the comparators forming the array. By maintaining a large number of the comparators in the "off" state (usually, only half of the comparators need to be enabled), a significant power savings can be realized.

7 Claims, 2 Drawing Sheets

POWER SAVING ARRANGEMENT FOR A FLASH A/D CONVERTER

TECHNICAL FIELD

The present invention relates to a power saving arrangement for a flash A/D converter and, more particularly, to an arrangement that saves power by regulating the number of comparators used to perform the conversion.

BACKGROUND OF THE INVENTION

Analog-to-digital (A/D) converters are employed to convert an analog signal received as an input to a digitally coded signal provided as an output. The analog input may be provided as a voltage or a current. The A/D converter may operate on a current, voltage or charge basis. The various types of A/D converters result in trade-offs between speed of completing the conversion versus the amount of hardware needed to achieve the conversion. At one end of this spectrum is the successive approximation A/D converter. Successive approximation A/D's operate to sequentially determine bits of the digital code corresponding to the analog input. Successive approximation A/D converters generally require one clock cycle per bit of resolution.

At the other end of the A/D spectrum is a parallel converter, generally referred to as a "flash" converter, that is capable of great speed due to the presence of sufficient hardware to complete the entire analog-to-digital conversion process simultaneously rather than sequentially. Flash converters generally require only one clock cycle to complete the entire analog-to-digital conversion process. Between these two ends of the A/D converter spectrum are a variety of hybrid and algorithmic converters. Flash A/D's usually employ a voltage applied across a precision resistor string. Intermediate taps at the resistor junctions, as well as in some cases at the resistor-potential junctions, are coupled to one input each of the plurality of comparators whose other inputs are tied in common. When the sampled analog input signal is applied to the commoned comparator input, the output states of the plurality of comparators are decoded to provide a digitally coded output word representative of the sampled analog input signal.

In a conventional flash A/D converter, the number of resistors forming the resistor string, as well as the number of comparators, required to provide an n-bit converter is substantially $2^n-1$. It can be seen that as the number of bits increase, the number of comparators and resistors increases more rapidly. Various techniques exist to reduce the number of resistors in the resistor string, and also the number of comparators, from $2^n-1$ to some smaller number, depending upon the reduction technique employed and the division between the number of most significant bits and the number of least significant bits.

Regardless of the topology of a flash A/D converter, however, the power expended in the conversion process will be the sum of the switching power and the quiescent power of each individual comparator. In some designs, the comparator quiescent power can be significant. Therefore, while flash A/D converters are considered preferred in terms of their speed, the power consumption may be unacceptable for many situations.

A need remaining in the prior art, therefore, is for a flash A/D converter that consumes less power, while not sacrificing the rapid conversion rate associated with flash converters.

SUMMARY OF THE INVENTION

The need remaining in the prior art is addressed by the present invention, which relates to a power saving arrangement for a flash A/D converter and, more particularly, to an arrangement that saves power by regulating the number of comparators used to perform the conversion.

In accordance with the present invention, a flash A/D converter is configured to include a predictor module coupled between the output and a control input of each comparator. The predictor module uses past value(s) of the output signal to predict the next output signal value. Based on this prediction, only a subset of the comparators in a predetermined window of values are enabled; the remaining comparators are maintained in an "off" (or "nearly off") state, thereby reducing the power consumed by the flash converter. The predictor logic can be relatively simple for a narrow band QPSK signal that does not change too fast with respect to the sampling rate. Various other predictor algorithms could be used for other signals. In any configuration, the power consumption of the flash A/D of the present invention will be far less than that associated with prior art arrangements, where the actual savings will be a function of the number of comparators being held in the "off" state.

BRIEF DESCRIPTION OF THE DRAWINGS

Referring now to the drawings.

DETAILED DESCRIPTION

Figure 1:
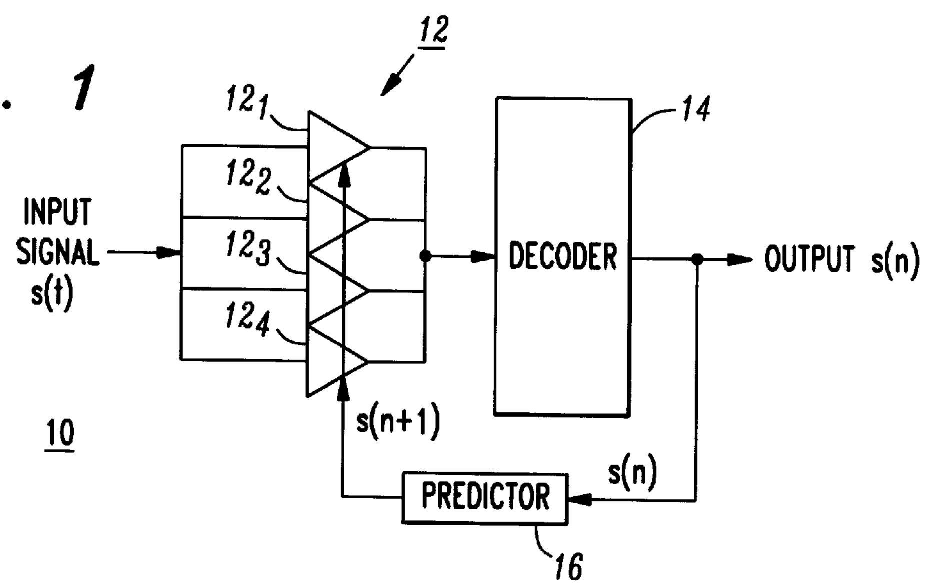
FIG. 1 illustrates an exemplary flash A/D converter incorporating the power saving arrangement of the present invention.

A block diagram of a flash A/D converter formed in accordance with the present invention is illustrated in FIG. 1. Flash A/D converter 10 receives an analog input signal s(t), which is provided as an input (the "commoned" input) to each comparator forming comparator array 12. Assuming an 8-bit output signal, comparator array 12 will comprise 255 separate comparators (i.e., $2^8-1$). It is to be understood that the power consumption arrangement of the present invention is applicable to any N-bit analog to digital conversion, the 8-bit example as discussed below is only for the purpose of illustration.

Referring back to FIG. 1, the outputs from comparator array 12 are subsequently applied as an input to a decoder 14 which provides the digital (8-bit) output signal s(n). In accordance with the present invention, output signal s(n) is also applied as an input to a predictor 16. Predictor 16 functions, as will be described in detail below, to estimate the next output value $\hat{s}(n+1)$ based on this current value s(n). Using this prediction, it can be assumed that certain subsets of comparator array 12 will not be required to perform the A/D conversion. That is, if $\hat{s}(n+1)$ is predicted to be a relatively low value, the "higher end" comparators are not required to perform an accurate analog to digital conversion and are therefore turned "off". Similarly, if $\hat{s}(n+1)$ is predicted to be a relatively high value, the "low end" comparators are not required and are therefore turned "off" by predictor 16. Summarizing, predictor 16 functions to provide an output control signal C that is applied as an input to comparator array 12, either turning "on" or "off" selected subsets of comparators. In one exemplary embodiment, the comparator array may be parsed into a number of overlapping "windows" and control signal C used to activate the "window" within which predicted value ŝ(n+1) will fall.

As mentioned above, for use with a narrowband QPSK signal, predictor 16 may utilize a simple first-order predictor model to ascertain the "next" output value. In particular, the following model has been found acceptable:

$$\hat{s}(n+1)=s(n)+(s(n)-s(n-1))$$

This model is acceptable as long as the signal is not changing too fast with respect to the sampling rate (for example, changing at a rate of about 2–3 Mhz for a sampling rate of 25.92 Mhz).

In accordance with the present invention, all comparators in a window centered around the predicted value ŝ(n+1) will be activated by the control signal output C from predictor 16. In one embodiment, the window "boundaries" may be chosen to divide comparator array 12 into quarters, denoted $\mathbf{12}_1$, $\mathbf{12}_2$, $\mathbf{12}_3$ and $\mathbf{12}_4$ in FIG. 1. Thus, there will be three enabling arrangements of the comparator array. For an 8-bit array, the three enabling arrangements are:

(1) Comparator quarters $\mathbf{12}_1$ and $\mathbf{12}_2$ enabled (bits 0–127), control signal $C_1$ (2) Comparator quarters $\mathbf{12}_2$ and $\mathbf{12}_3$ enabled (bits 64 to 191), control signal $C_2$ (3) Comparator quarters $\mathbf{12}_3$ and $\mathbf{12}_4$ enabled (bits 128 to 254), control signal $C_3$.

Therefore, depending upon the predicted value of ŝ(n+1), predictor 16 will provide as an output one of the three control signals $C_1$, $C_2$ or $C_3$. Since in any given situation half of the comparators will be disabled, a significant power savings will be achieved.

Figure 2:
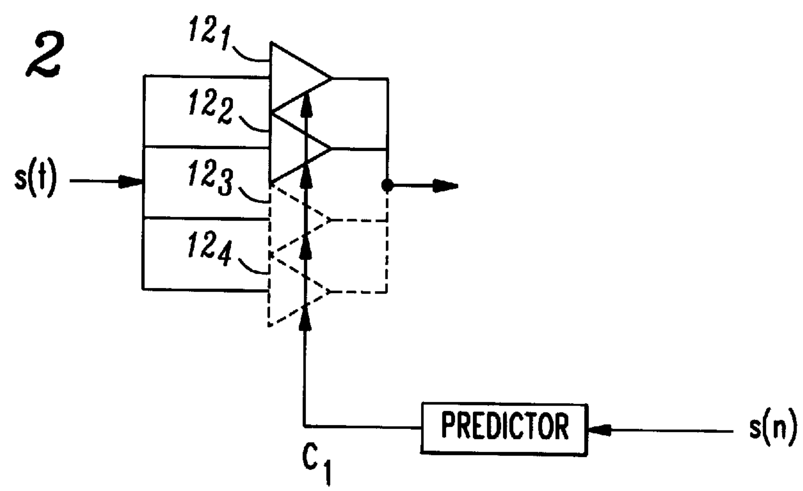
FIG. 2 is a diagram representing the inventive flash A/D converter with only the lower half (i.e., bits 0 to 127) of the comparators enabled.
Figure 3:
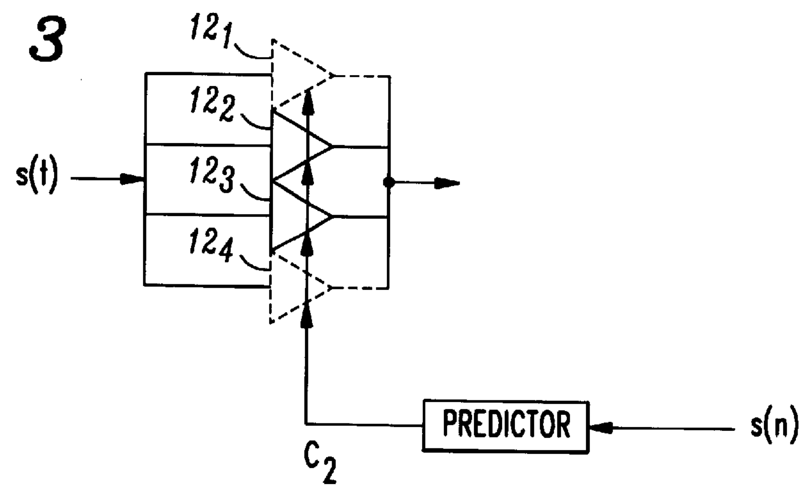
FIG. 3 is a diagram representing the inventive flash A/D converter with only the middle half (i.e., bits 64 to 191) of the comparators enabled.
Figure 4:
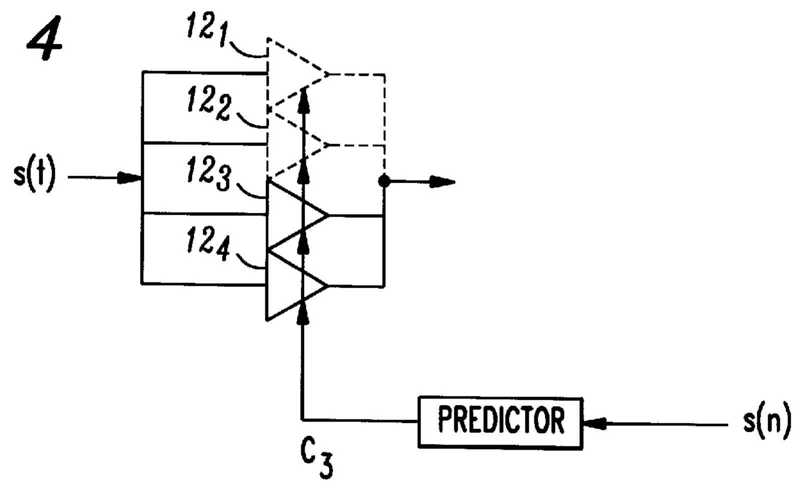
FIG. 4 is a diagram representing the inventive flash A/D converter with only the upper half (i.e., bits 128 to 254) of the comparators enabled.

FIG. 2 illustrates the state of flash A/D converter 10 when predictor 16 sends a control signal $C_1$ to comparator array 12. In particular, subsets $\mathbf{12}_3$ and $\mathbf{12}_4$ are illustrated in phantom to designate their "disabled" state. Similarly, FIG. 3 illustrates flash A/D converter 10 as set by control signal $C_2$ from predictor 16 (that is, subsets $\mathbf{12}_1$ and $\mathbf{12}_4$ illustrated in phantom as "disabled"). Lastly, FIG. 4 illustrates flash A/D converter 10 when comparator array 12 receives a $C_3$ control signal (subsets $\mathbf{12}_1$ and $\mathbf{12}_2$ disabled).

Figure 5:
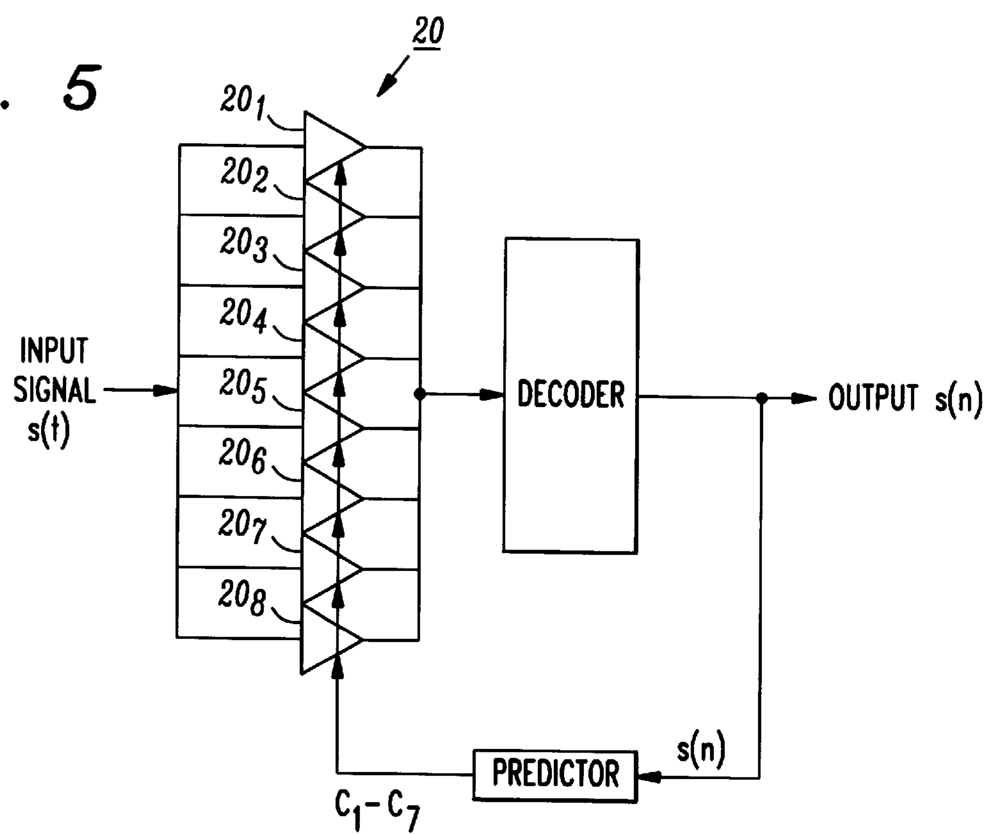
FIG. 5 illustrates an alternative embodiment of the present invention, using a finer parsing of the comparator array within the flash AMD converter.

It is to be understood that other parsings of the comparator array may be used. In one alternative embodiment, for example, the comparator can simply be divided into a lower half (bits 0 through 127) and an upper half (bits 128 through 254). In this case, there is no overlapping, but the number of control signals is reduced. Alternatively, the array may be parsed into eighths (a "finer" parsing), as shown in FIG. 5. Referring to FIG. 5, an exemplary comparator array 20 has been divided into eight subsets, using a set of 7 enabling control signals as follows:

(1) Subsets $\mathbf{20}_1$ and $\mathbf{20}_2$ enabled (bits 0–63), control signal $c_1$ (2) Subsets $\mathbf{20}_2$ and $\mathbf{20}_3$ enabled (bits 32–95), control signal $c_2$ (3) Subsets $\mathbf{20}_3$ and $\mathbf{20}_4$ enabled (bits 64–127), control signal $c_3$ (4) Subsets $\mathbf{20}_4$ and $\mathbf{20}_5$ enabled (bits 96–159), control signal $c_4$ (5) Subsets $\mathbf{20}_5$ and $\mathbf{20}_6$ enabled (bits 128–191), control signal $c_5$ (6) Subsets $\mathbf{20}_6$ and $\mathbf{20}_7$ enabled (bits 160–223), control signal $c_6$ (7) Subsets $\mathbf{20}_7$ and $\mathbf{20}_8$ enabled (bits 192–254), control signal $c_7$ Therefore, only one quarter of the comparator array will be enabled at any time. This arrangement realizes an increased power savings over the arrangement of FIG. 1. However, the savings in power is a trade-off with an increase in likelihood that a predicted value ŝ(n+1) will fall outside the current prediction window (resulting in an increase in noise).

For faster signals, a more complicated predictor model (second- or third-order) can be employed. Even with a more complicated predictor, a significant energy savings will occur.

It is to be understood that there are various other arrangements of the comparator array, as well as predictor models, that may be used and all are considered to fall within the spirit and scope of the present invention.

What is claimed is:

1. An integrated circuit including a converter for converting an analog input signal into a digital output signal, comprising:

a comparator array comprising a plurality of separate comparators, each comparator receiving in parallel the analog input signal as a first input and a reference signal as a second input signal and providing an output signal representative of the difference between the first and second input signals;

decoding means responsive to the plurality of output signals from said comparator array for combining the plurality of output signals to form the digital output signal (s(n))

CHARACTERIZED IN THAT the converter further comprises predictor means coupled between the output of the decoding means and the comparator array for predicting a subsequent digital output signal value (ŝ(n+1)) and enabling only a subset of comparators of said comparator array in a predetermined window around said predicted value.

2. An integrated circuit as defined in claim 1 wherein the comparator array is defined as including a lower half and an upper half such that the predictor means functions to enable only one half of said comparator array, based upon the predicted output signal value.

3. An integrated circuit as defined in claim 1 wherein the comparator array is parsed into quarters and the predictor means functions to enable the two quarters of said comparator array surrounding the predicted output signal value.

4. An integrated circuit as defined in claim 1 wherein the digital output signal comprises N bits and the comparator array comprises $2^N-1$ comparators, wherein the comparator array is parsed into m subsets, $2^N/m$ being a whole number and the predictor means functions to enable 2 m comparators of said comparator array surrounding the predicted output signal value.

5. An integrated circuit as defined in claim 4 wherein the value of m is chosen to predicted the comparator array into overlapping subsets.

6. An integrated circuit as defined in claim 4 wherein the value of m is chosen to parse the comparator array into non-overlapping, contiguous subsets.

7. An integrated circuit as defined in claim 1 wherein the predictor uses the following relation to determine the predicted signal value: ŝ(n+1)=s(n)+(s(n)−s(n−1)).

* * * * *